(12) United States Patent
Jesman et al.

(10) Patent No.: US 6,285,331 B1
(45) Date of Patent: Sep. 4, 2001

(54) ANTENNA MORE ESPECIALLY FOR MOTOR VEHICLES

(76) Inventors: Andrew Jesman, Highdown, Longdown Rd., Guildford, Surrey (GB), GU4 8PP; Christopher Jesman, "Westhaven" 6 Rosebriars, Esher Park Ave., Esher, Surrey (GB), KT10 9NN ( * ) Notice: Subject to any disclaimer, the term of this patent is extended or adjusted under 35 U.S.C. 154(b) by 0 days.

(21) Appl. No.: 09/381,626
(22) PCT Filed: Jul. 4, 1997
(86) PCT No.: PCT/GB97/01809
 § 371 Date: Nov. 29, 1999
 § 102(e) Date: Nov. 29, 1999
(87) PCT Pub. No.: WO98/44585
 PCT Pub. Date: Oct. 8, 1998

(30) Foreign Application Priority Data

Mar. 27, 1997 (GB) .................................................. 9706371

(51) Int. Cl.[7] .................................................. H01Q 1/32
(52) U.S. Cl. .......................... 343/713; 343/860; 343/872
(58) Field of Search .................................. 343/713, 860, 343/861, 700 MS, 872; 333/24 C

(56) References Cited

U.S. PATENT DOCUMENTS

| | | | |
|---|---|---|---|
| 4,163,195 | 7/1979 | Sauer | 325/313 |
| 4,931,805 | * 6/1990 | Fisher | 343/715 |
| 4,992,800 | 2/1991 | Parfitt | 343/713 |
| 5,005,019 | 4/1991 | Zaghloul et al. | 343/700 |
| 5,212,492 | * 5/1993 | Jesman et al. | 343/713 |
| 5,235,736 | 8/1993 | Hahs, Jr. et al. | 29/600 |
| 5,278,572 | * 1/1994 | Harada et al. | 343/713 |
| 5,422,649 | 6/1995 | Huang | 343/700 |
| 5,457,470 | * 10/1995 | Hai et al. | 343/828 |
| 5,565,877 | * 10/1996 | Du et al. | 343/715 |
| 5,742,255 | * 4/1998 | Afendras | 343/713 |

FOREIGN PATENT DOCUMENTS 0 456 350  11/1991  (EP) .

* cited by examiner

Primary Examiner—Tan Ho
(74) Attorney, Agent, or Firm—Jacobson Holman, PLLC

(57) ABSTRACT

An on-glass or glass-mount antenna for a motor vehicle has a mounting base incorporating a capacitor plate (4) arranged to be secured to the surface of a window or screen of the vehicle. The radiating element (3) of the antenna is located in substantially the same plane as the capacitor plate (4) and, when enclosed by a protective dielectric cover (9) which conforms closely to the glass surface, provides an aerodynamic and vandal resistant antenna.

19 Claims, 3 Drawing Sheets

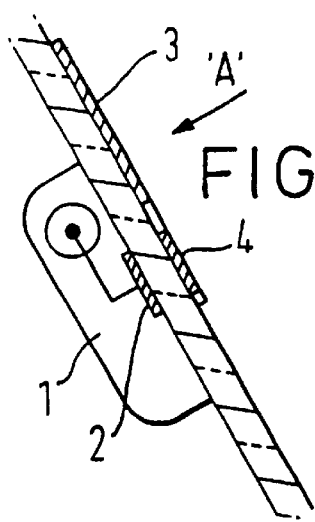
FIG. 1.
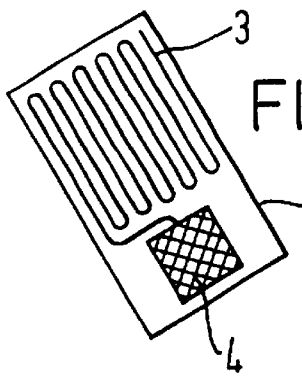
FIG. 2.
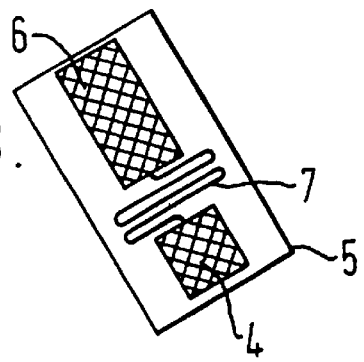
FIG. 3.
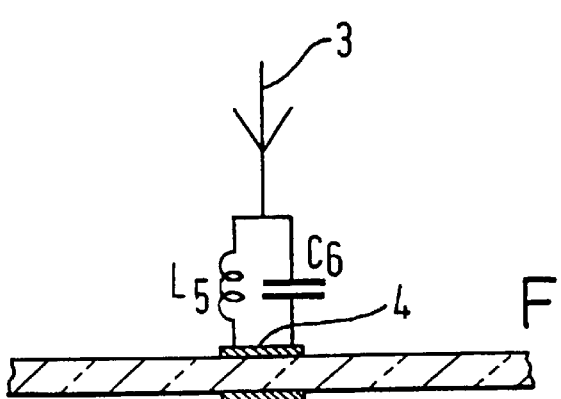
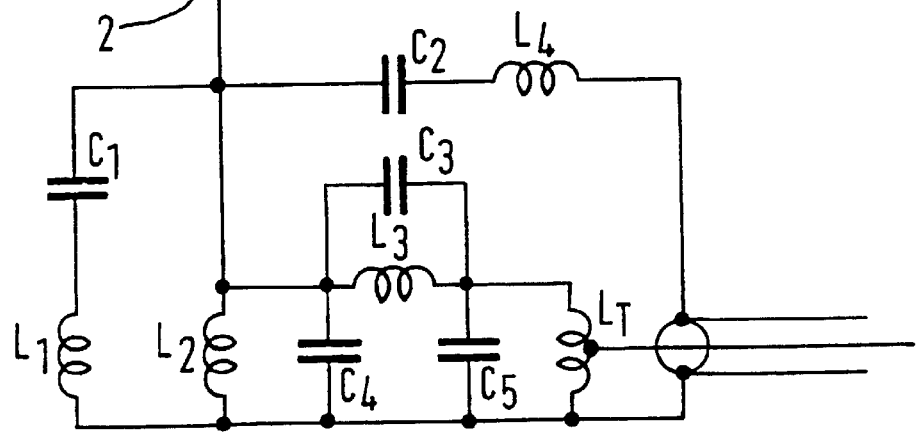
FIG. 4.

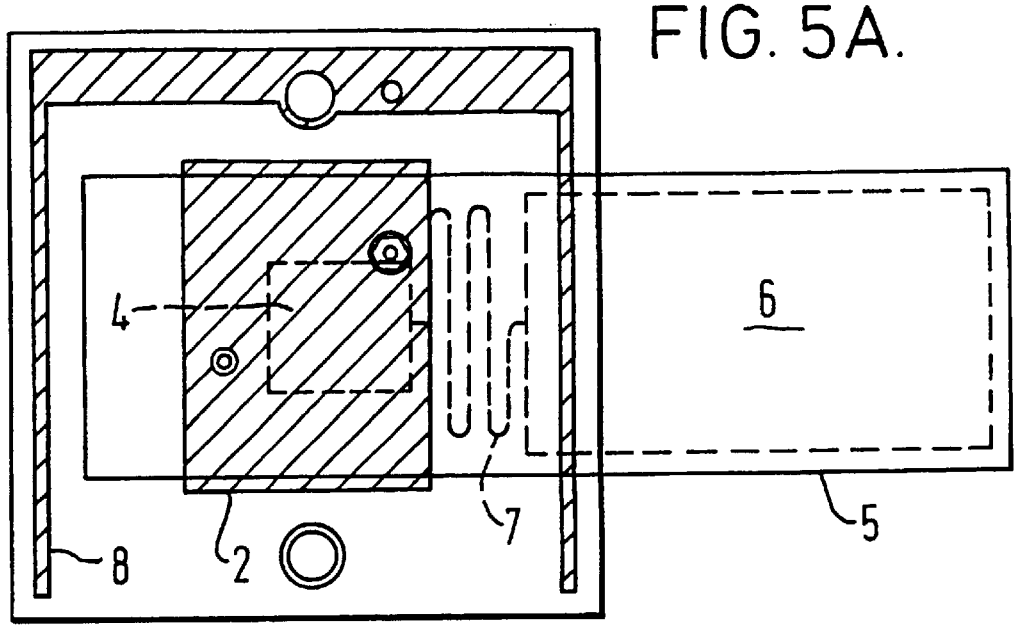
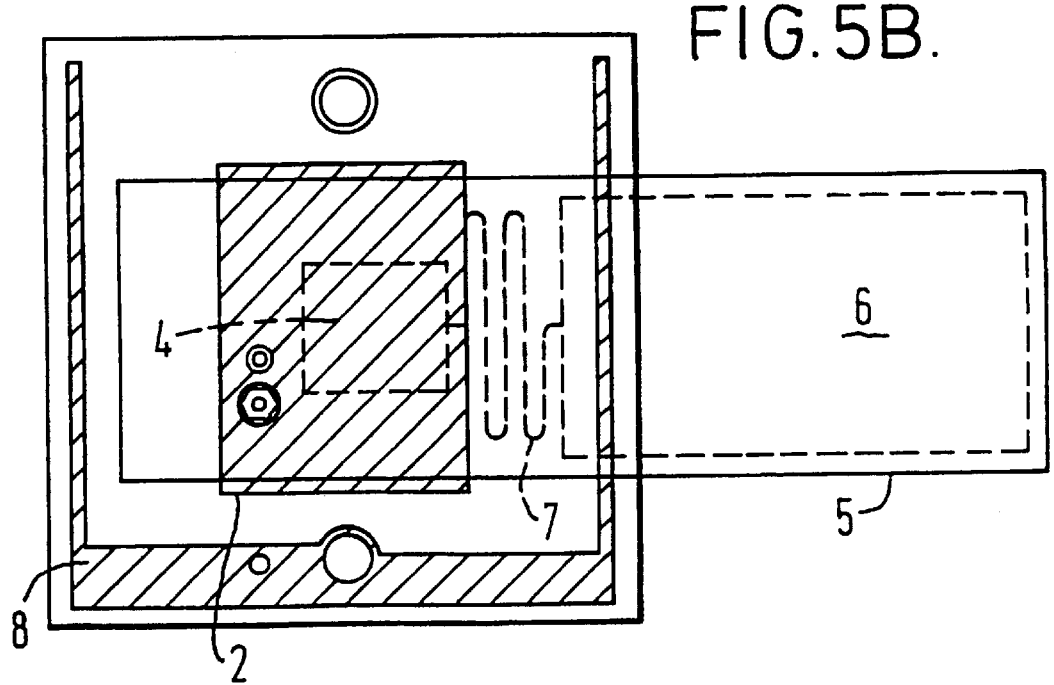

ANTENNA MORE ESPECIALLY FOR MOTOR VEHICLES

FIELD OF THE INVENTION

This invention concerns improvements in and relating to antennas for use in providing radio communication to and/or from motor vehicles, more especially in the higher frequency wavebands employed by mobile telephones or like equipment.

BACKGROUND

Recently there has become known a radio antenna of this type that is referred to as an "on glass or glass-mount" antenna. Such antennas comprise a radiating element that is mounted externally on a glass window or windscreen of the vehicle and an internal connector that is coupled to radio apparatus within the vehicle and is coupled to the external antenna by a capacitor plate mounted to the internal surface of the windscreen and cooperating with an external capacitor plate electrically coupled to the external antenna. The overlapping internal and external capacitor plates together with the dielectric material of the glass form a capacitor that couples the internal connector to the external antenna and may form part of a matching circuit that also serves to match the impedance of the antenna to the radio apparatus. An example of an internal connector utilising this arrangement is described in European Patent No. 0456350.

The external antenna in such an arrangement is, apart from the coupling capacitor, of conventional form and comprises the normal rod or whip-like conductor that has a length corresponding to a fraction of the working wavelength and is loaded by an inductance that is usually incorporated in the whip to provide base or centre loading of the antenna.

Whilst an external antenna of this kind is functionally effective, in the context of a motor vehicle it has the severe disadvantage that it is vulnerable to vandalism when the vehicle is unattended.

SUMMARY OF THE INVENTION

It is accordingly an object of the invention to address this problem.

The invention provides an "on glass or glass-mount" antenna for a motor vehicle having a mounting base incorporating a capacitor plate arranged to be secured to the surface of a window or screen of the vehicle, characterised in that the radiating clement of the antenna is located in substantially the sane plane as the capacitor plate.

Preferably, the radiating element and capacitor plate are enclosed by a protective dielectric cover conforming closely to the glass surface, The arrangement according to the invention is based upon the surprising observation that an antenna of appropriate configuration can be arranged to lie flush with the glass surface forming the dielectric of the coupling capacitor, and can operate effectively without the need for the conventional whip that in known designs has extended away from the glass, to form a target for vandals. The arrangement further provides a reduction in wind noise, and resistance to damage in car washes.

The antenna may be formed in any desired manner, and could be comprised of elements of electrically conductive material such as, for example, metal embedded in the dielectric cover. Preferably however the antenna is formed by conductive tracks of a printed circuit board. The circuit board may itself embody the dielectric cover, but preferably the board is arranged to fit within a separate cover of synthetic plastics material that is moulded to an aesthetically pleasing shape whilst having a profile that conforms closely to the glass surface and can be secured thereto by a suitable adhesive,

BRIEF DESCRIPTION OF THE DRAWINGS

Further preferred features and advantages of the invention will become apparent from the following description taken in conjunction with the accompanying drawings, in which:

FIG. 1 is a sectional side elevation of an antenna arrangement in accordance with the invention shown in diagrammatic form, FIG. 2 is a plan view of a printed circuit board providing the external radiating antenna shown in FIG. 2, FIG. 3 is a view similar to FIG. 2 showing an alternative arrangement of printed circuit board track providing the external radiating antenna, FIG. 4 is a circuit diagram showing the equivalent circuit of the antenna arrangement shown in FIG. 1, FIG. 5A is a diagrammatic plan view illustrating the registration between the printed circuit board of FIG. 3 and an internal circuit board of the coupling box illustrated in FIG. 1, when attached to a glass screen, FIG. 5B is a similar view showing an alternative relationship of the two printed circuit boards.

DETAILED DESCRIPTION OF THE INVENTION

Figure 6:
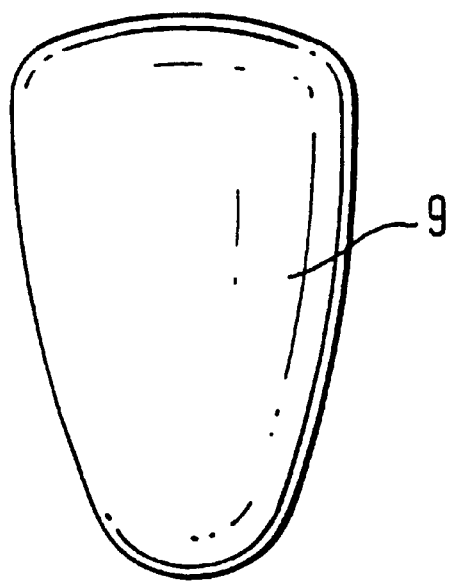
FIG. 6 is a plan view of a dielectric shell for enclosing the external printed circuit board of the arrangement of FIG. 1.

Referring to the drawings, there is shown in FIG. 1 an antenna assembly comprising a coupling box 1 providing a matched coupling to a radio transceiver, for example a mobile telephone, in the manner described in the above-mentioned European Patent No. 0456350. The construction of the coupling box is identical to that described therein, and will not therefore be described in further detail.

In known manner, the coupling box 1 is secured to tile inside surface of a glass windscreen of a motor vehicle and has a capacitance pad 2 facing the glass surface and providing electrical coupling to an external antenna 3 via a similar capacitance pad 4 electrically coupled to the external antenna.

As shown in FIG. 2, which is a plan view of the antenna 3 as viewed in the direction of the arrow A of FIG. 1, it will be seen that the external antenna is provided by a folded track formed on a printed circuit board 5 and connected to the capacitance pad 4, that is formed integrally with the radiating antenna 3 by the conventional foil padding on the printed circuit board 5.

FIG. 3 shows an alternative arrangement of antenna wherein the radiating antenna element is formed as a continuous electrically conductive area 6 connected to the capacitance pad 4 by means of a folded track 7 forming an inductive element that serves to tune the antenna and also to provide impedance matching as described in more detail below.

FIG. 4 shows the equivalent electrical circuit of the coupling box 1 and the external antenna shown in FIG. 3, wherein the circuit shown connected to the capacitance pad 2 is provided by overlapping tracks on the surfaces of a printed circuit board, as described in European Patent No. 0456350.

The impedance matching circuit shown coupled between the external capacitor plate 4 and the antenna 3, ie the parallel capacitance C6 and inductance L5, is provided as a result of the cooperation between the conductive tracks on the circuit board 5 of FIG. 3 and a circuit board of the coupling box 1 that is arranged to overlap the printed circuit board 5 on the inside surface of the glass screen.

FIG. 5A shows an arrangement in which such an impedance matching circuit is formed, from which it will be seen that the capacitance pad 4, the inductive portion 7 and the area 6 of the antenna partially overlap the capacitance pad 2 of the coupling box 1 and also a further electrically conductive area of padding 8 formed on the same surface of the internal printed circuit board as the pad 2. The function of these conductive areas of the printed circuit board of the coupling box 1 is fully described in the above-mentioned European Patent specification and will not therefore be referred to in more detail herein.

FIG. 5B shows a similar arrangement wherein the relative positions of the internal and external printed circuit boards are symmetrically reversed. This enables the external antenna to be mounted on a screen facing either upwards or downwards as desired.

Figure 7:
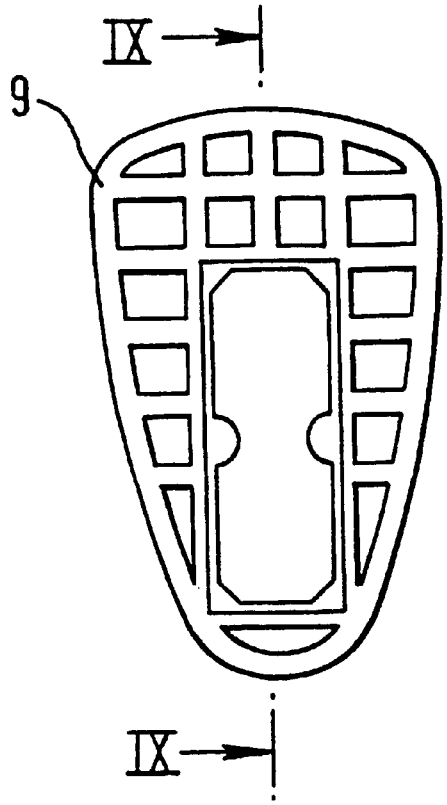
FIG. 7 is an underneath view corresponding to FIG. 6.
Figure 8:
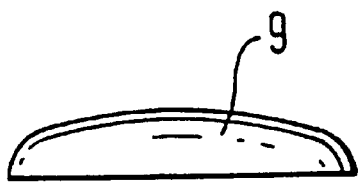
FIG. 8 is an end elevation corresponding to FIG. 6.
Figure 9:
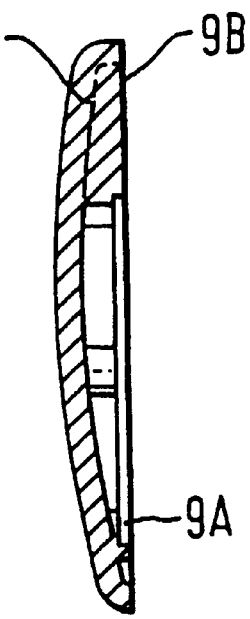
FIG. 9 is a sectional view taken on the line IX—IX of FIG. 7.

In order to provide protection for the external printed circuit board forming the antenna 3, the circuit board 5 is enclosed within a protective shell of dielectric material, for example of injection moulded synthetic plastics material, as shown in more detail in FIGS. 6 to 9.

The synthetic plastics shell which is indicated by reference numeral 9 includes a rectangular recess 9A shaped to receive the printed circuit board therein with an external surface flush with a flat surface 9B of the shell 9. In use the circuit board 5 may be cemented within the recess 9A and the exposed flat surface covered by means of an appropriate adhesive pad extending over the full surface of the shell 9 as viewed in FIG. 7 in order to provide a self-adhesive surface by means of which the shell 9 may be adhered to a glass windscreen.

The arrangement as described above provides a compact external antenna for use on the screen of a motor vehicle and is intended for operation in the particular embodiment described, in the GSM(870–960 MHz) and PCN (1710–1880MHz) frequency ranges. In a non-illustrated variant of the invention, an antenna capable of operating with a dual standard GSM/PCN transceiver is coupled to a suitably adapted coupling box. The coupling box drives the antenna whose radiating element is arranged to be resonant at both GSM and PCN frequencies. The exterior of the antenna is designed to be slim, stylish and less prone to theft or vandal damage compared to known designs, whilst providing comparable electrical performance.

What is claimed is:

1. An on glass or glass-mount antenna comprising a radiating element and a mounting base incorporating a capacitor plate arranged to be secured to a dielectric surface, wherein both the radiating element and the capacitor plate are formed by tracks of a printed circuit board, are both located in substantially the same plane and are both enclosed by a protective outer cover, the outer cover also being arranged to be secured to the dielectric surface.

2. An antenna as claimed in claim 1, in combination with a connector comprising a further capacitor plate included in a matching circuit for coupling to a radio apparatus, the arrangement being such that, with the capacitor plates of the antenna and the connector attached to opposite surfaces of a dielectric plate, capacitative coupling is provided between the antenna and the radio apparatus.

3. An antenna as claimed in claim 2, wherein both the antenna and the connector are formed by tracks of printed circuit boards and the arrangement is further such that, in use, the tracks of the respective boards cooperate to form an inductive and capacitative matching circuit coupled in series between the capacitor plate of the antenna and the radiating element.

4. An antenna as claimed in claim 3, wherein the radiating element embodies a dielectric cover.

5. An antenna as claimed in claim 3, wherein the radiating element embodies a dielectric cover.

6. An antenna as claimed in claim 2, wherein the dielectric plate is the glass surface of a motor vehicle wind screen.

7. An antenna as claimed in claim 6, wherein the radiating element embodies a dielectric cover.

8. An antenna as claimed in claim 6, wherein the radiating element embodies a dielectric cover.

9. An antenna as claimed in claim 2, wherein the radiating element embodies a dielectric cover.

10. An antenna as claimed in claim 2, wherein the radiating element embodies a dielectric cover.

11. An antenna as claimed claim 1, wherein the radiating element embodies a dielectric cover.

12. An antenna as claimed in claim 1, wherein the radiating element is enclosed together with the capacitor plate by a protective outer cover.

13. An antenna as claimed in claim 12, wherein the outer cover is of a synthetic plastics material with a profile that conforms closely to the dielectric surface.

14. An antenna as claimed in claim 13, wherein the outer cover is provided with adhesive means for securing it to the dielectric surface.

15. An antenna as claimed in claim 12, wherein the outer cover is provided with adhesive means for securing it to the dielectric surface.

16. An antenna as claimed in claim 1, wherein the radiating element embodies a dielectric cover.

17. An antenna as claimed in claim 1, wherein the radiating element is enclosed together with the capacitor plate by a protective outer cover.

18. An antenna as claimed in claim 1 which is the on-glass antenna.

19. An antenna as claimed in claim 1 which is the glass-mount antenna.

* * * * *